United States Patent
Wielage et al.

(10) Patent No.: US 7,885,093 B2
(45) Date of Patent: Feb. 8, 2011

(54) METHOD FOR TESTING A STATIC RANDOM ACCESS MEMORY

(75) Inventors: Paul Wielage, Waalre (NL); Mohamed Azimane, Eindhoven (NL)

(73) Assignee: NXP B.V., Eindhoven (NL)

( * ) Notice: Subject to any disclaimer, the term of this patent is extended or adjusted under 35 U.S.C. 154(b) by 181 days.

(21) Appl. No.: 12/438,325

(22) PCT Filed: Aug. 21, 2007

(86) PCT No.: PCT/IB2007/053337

§ 371 (c)(1),
(2), (4) Date: Feb. 20, 2009

(87) PCT Pub. No.: WO2008/023334

PCT Pub. Date: Feb. 28, 2008

(65) Prior Publication Data

US 2010/0014369 A1  Jan. 21, 2010

(30) Foreign Application Priority Data

Aug. 22, 2006 (EP) .................................. 06119335

(51) Int. Cl.
*G11C 11/00* (2006.01)
(52) U.S. Cl. .................................. 365/154; 365/230.05
(58) Field of Classification Search .................. 365/154, 365/230.05, 156
See application file for complete search history.

(56) References Cited

U.S. PATENT DOCUMENTS

| | | | |
|---|---|---|---|
| 5,361,232 A | 11/1994 | Petschauer et al. | |
| 5,559,745 A | 9/1996 | Banik et al. | |
| 6,256,241 B1 * | 7/2001 | Mehalel | 365/201 |
| 6,463,557 B1 | 10/2002 | Docker | |
| 6,501,692 B1 * | 12/2002 | Melanson et al. | 365/201 |
| 6,590,818 B1 | 7/2003 | Liston | |
| 6,643,804 B1 | 11/2003 | Aipperspach et al. | |
| 6,778,450 B2 | 8/2004 | Selvin et al. | |
| 2002/0033723 A1 | 3/2002 | Lee et al. | |
| 2004/0245566 A1 | 12/2004 | Lee | |
| 2009/0073782 A1 * | 3/2009 | Hanafi et al. | 365/189.09 |

FOREIGN PATENT DOCUMENTS

WO  2006/056902 A1  1/2006

OTHER PUBLICATIONS

Pavlov, Andrei, et al; "Weak Cell Detection in Deep-Submicron SRAMs: A Programmable Detection Technique"; pp. 1-10.

* cited by examiner

*Primary Examiner*—Anh Phung

(57) ABSTRACT

A method testing an SRAM having a plurality of memory cells is disclosed. In a first step, a bit value is written into a cell under test (CUT). Subsequently, the first and second enabling transistors are disabled and the bit lines are discharged to a low potential. Next, the word line (WL) coupled to the memory cell under test is activated for a predetermined period. During a first part of this period, one of the bit lines (BLB) is kept at the low potential to force the associated pull up transistor in the CUT into a conductive state, after which this bit line (BLB) is charged to a high potential. Upon completion of this period, the bit value of the first cell is determined. The method facilitates the detection of weak or faulty SRAM cells without requiring the inclusion of dedicated hardware for this purpose.

6 Claims, 6 Drawing Sheets

METHOD FOR TESTING A STATIC RANDOM ACCESS MEMORY

A static random access memory (SRAM) is a memory chip that requires power to hold its content, i.e. it retains data bits in its memory as long as power is being supplied. It is made up of a latch circuit that lets current flow through one side or the other based on which one of two select transistors is activated. Unlike Dynamic RAM (DRAM), SRAM does not require refresh circuitry for periodically refreshing the cells. SRAM also provides faster access to data than DRAM. However, it also takes up more space, uses more power and tends to be more expensive than DRAM. SRAM is commonly used for a computer's cache memory and as part of the random access memory digital-to-analogue converter on a video card, for example.

FIG. 1 of the drawings illustrates a commonly used six-transistor (6T) SRAM cell. A first inverter 100 comprising a P-channel transistor 102 and an N-channel transistor 104, and a second inverter 200 comprising a P-channel transistor 202 and an N-channel transistor 204 are interconnected in a known cross-coupled fashion to form a latch. A first N-channel select transistor 106 couples the latch to a first bit line BLB and a second N-channel select transistor 108 couples the latch to a second bit line BL. The gates of the N-channel select transistors 106, 108 are coupled to a word line WL.

The six-transistor (6T) CMOS SRAM cell described above offers many advantages over a four-transistor (4T) SRAM cell for microprocessor or microcontroller designs, including the potential for perfect data retention because of its active pull-up PMOS transistors. However, this perfect data retention potential has not previously been realized, because some open-circuit defects, often called weak defects, are known to cause retention failures. This type of defect, typically caused by factors such as resistive defects, excessive process shifts, transistor mismatch, IR drops, etc., can cause unpredictable data retention failures that are process, temperature and time dependent. As such retention failure tends to be random because cells are not entirely damaged and retention failure (characterized by state flipping) is triggered only under certain operating conditions, such as electrical disturbance (e.g. power supply noise), read/write cell disturbance, etc. during normal operation of the SRAM. Consequently, the conventional retention detection technique of high-temperature bakes and test algorithms such as N-March may not detect this type of fault.

For the purpose of the following, weak cells can be defined as cells whose static noise margin (SNM) is close to zero. Consequently, such cells can inadvertently flip their state. SNM is a measure of the logic circuit's tolerance to noise in either of the states, i.e. by how much the input voltage can change without disturbing the present logic state. In other words, the SNM represents a measure of cell robustness. Referring to FIG. 2 of the drawings, there is illustrated a transfer function of a cell with highlighted static noise margins. The SNM is defined as the side of the maximum square that can be embedded between the transfer characteristics of the two cell inverters. Points X and Y on the characteristics represent two stable states and the intersection point Z represents the meta-stable point. A small disturbance around Z towards X or Y will cause the cell to flip to state X or Y respectively.

Referring to FIG. 3 of the drawings, there is illustrated the transfer characteristics of a good SRAM cell (solid line) and a weak SRAM cell (broken line). The axes represent the node voltages, which in turn are proportional to the bit line voltages. $VM_{good}$ and $VM_{weak}$ represent the metastability points of a good and a weak cell. If an SRAM cell internal node is brought to the level of VM, then a small voltage increment will flip the cell towards the direction of this increment. Points $X_1$, $Y_1$ ($X_2$, $Y_2$) on the transfer characteristic represent the stable states $Z_1$ ($Z_2$)—the metastable states of the good (weak) cell respectively. As is apparent from FIG. 3, the weak cell has a significantly smaller SNM than that of the good cell.

There exist several prior art solutions for detecting weak cells in SRAMs. For instance, U.S. Pat. No. 6,778,450 discloses an apparatus and method for the detection of weak cells having a range of transfer characteristics. To this end, a cell under test is coupled to a bias voltage generator, which can be configured by selecting a predefined bias voltage. Since different bias voltages enable the detection of different metastable points, a range of weak cells can be detected with this approach.

An alternative approach has been disclosed in PCT patent application WO2006/056902-A1, in which a weak cell is detected by storing opposite data values in a cell under test and a reference cell respectively, and providing the word line of the reference cell with a train of enabling pulses to partially discharge a bit line, with alterations to the number and width of the pulses facilitating the variation of the potential on this bit line. The cell under test is subsequently exposed to various potential values to accurately determine the SNM of this cell.

In U.S. Pat. No. 6,590,818, another arrangement for detecting weak SRAM cells is disclosed. The SRAM disclosed in this patent is operable in a soft defect detection (SDD) mode. To this end, SDD conditioning circuits are coupled between each pair of bit lines. The SDD conditioning circuits are configured to charge the bit lines to respective predetermined voltages, after which the bit lines are shorted to establish an intermediate voltage on both bit lines, to which the cells are exposed by activating their word lines. This will cause a weak SRAM cell to invert its stored bit value.

A common drawback of these prior art methods is that the SRAM typically requires some additional hardware dedicated to facilitate the weak cell detection. This is not always acceptable, for instance because the additional hardware adds to the cost of the SRAM. Moreover, the aforementioned test methods may not be capable of detecting certain types of resistive opens associated with the pull-up transistors of the cells of the memory.

The present invention seeks to provide a method for testing an SRAM that reduces the SRAM area overhead and that facilitates the detection of resistive opens in the pull-up transistors of the memory cells.

According to a first aspect of the present invention, there is provided a method for testing a static random access memory having a plurality of memory cells, each memory cell comprising a cross-coupled inverter pair coupled between a high potential source and a low potential source, the first inverter of the inverter pair having its control terminals coupled to a first bit line via a first enable transistor, and the second inverter of the inverter pair having its control terminals coupled to a second bit line via a second enable transistor, the first and second enable transistors having their respective control terminals coupled to a word line, the method comprising:

(a) writing a first bit value into a first memory cell;
(b) disabling the first and second enabling transistors of the first memory cell;
(c) discharging the first bit line and the second bitline coupled to the first memory cell to a low potential;
(d) activating the word line coupled to the memory cell for a predetermined period whilst keeping the first bit line coupled to the first memory cell at the low potential during a predetermined part of said period;

(e) bringing said first bit line to a high potential upon completion of the predetermined part; and (f) determining the bit value of the cell under test after the predetermined period.

The method of the present invention uses a fundamentally different approach than the prior art methods, which typically target a bit flip in a weak SRAM cell to detect such cells. In contrast, the method of the present invention detects whether the pull-up transistors in an SRAM cell are capable of pulling up its associated bit lines by storing a defined bit value in a cell under test (CUT) to bring the cell in a well-defined state and subsequently checking if, from this well-defined initial state, a floating bit line can be pulled-up by a pull-up transistor of the CUT, without requiring a comparison between the data written to the cell in step (a) and retrieved from the cell in step (f). In case of a weak cell, the pull-up transistor is typically incapable of charging the capacitance of its associated bit line because of a resistive defect or a threshold shift for the pull-up transistor under test.

Advantageously, the method further comprises repeating steps (a)-(f) for a different predetermined delay to allow accurate determination of the SNM of the cell under test.

Steps (a)-(f) may also be repeated to by interchanging the role of the first and the second bit line that are coupled to the cell under test in order to test the other pull-up transistor of the cell under test.

The present invention is described in more detail and by way of examples only and with reference to the accompanying drawings, in which.

It should be understood that the Figures are merely schematic and are not drawn to scale. It should also be understood that the same reference numerals are used throughout the Figures to indicate the same or similar parts.

Figure 1:
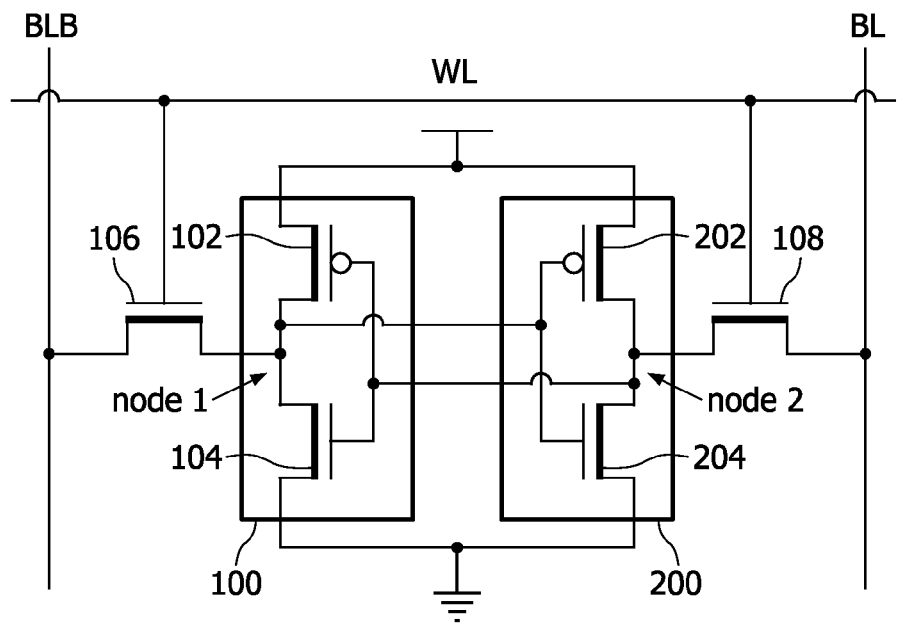
FIG. 1 is a circuit diagram showing the configuration of a conventional six-transistor SRAM cell.
Figure 2:
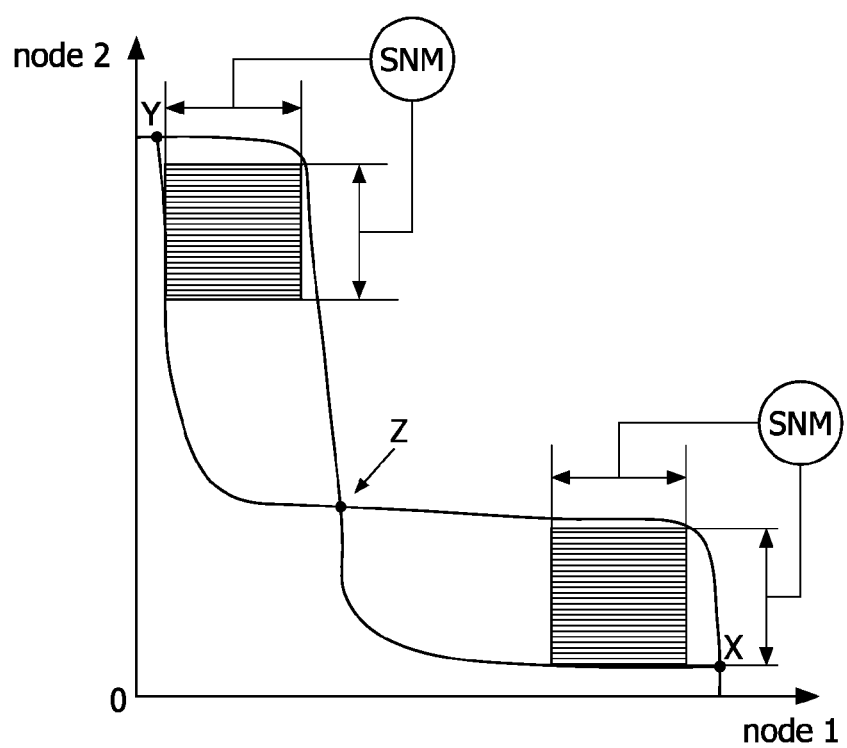
FIG. 2 shows a transfer function of a memory cell with highlighted static noise margins.
Figure 3:
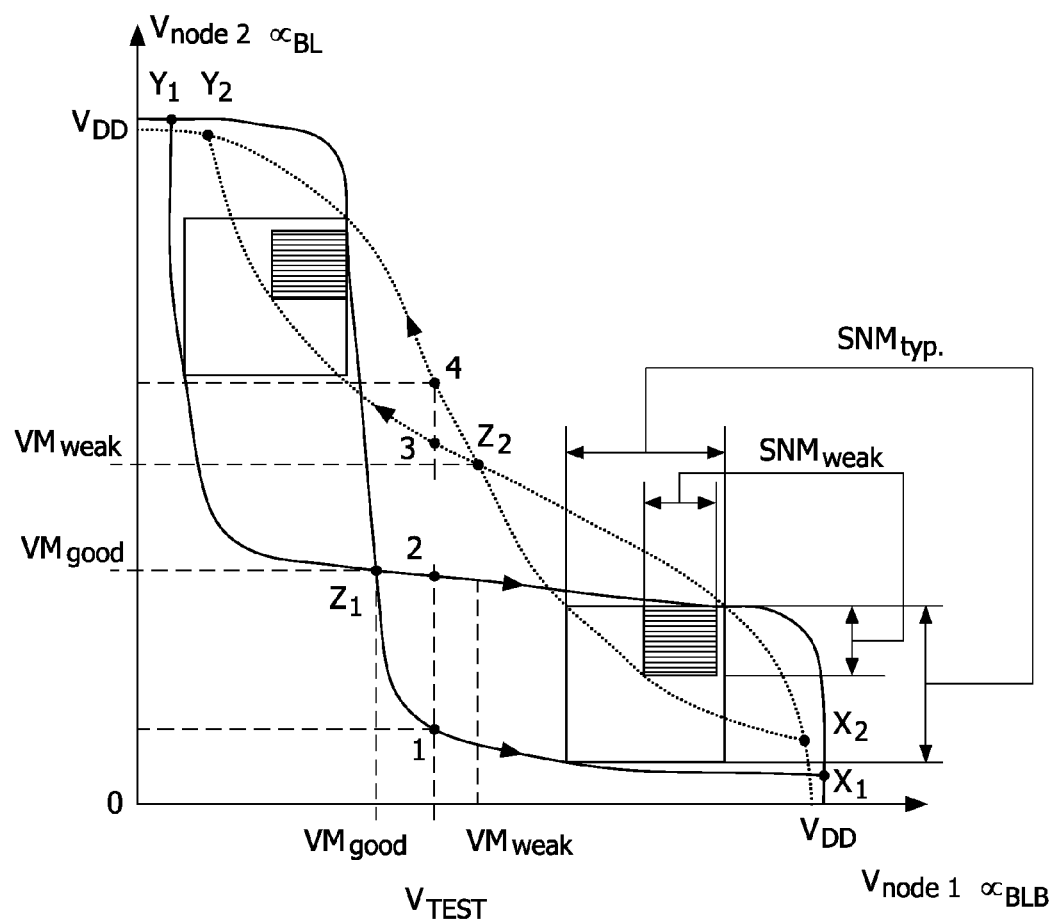
FIG. 3 shows the transfer functions of a good and weak SRAM cell respectively.
Figure 4:
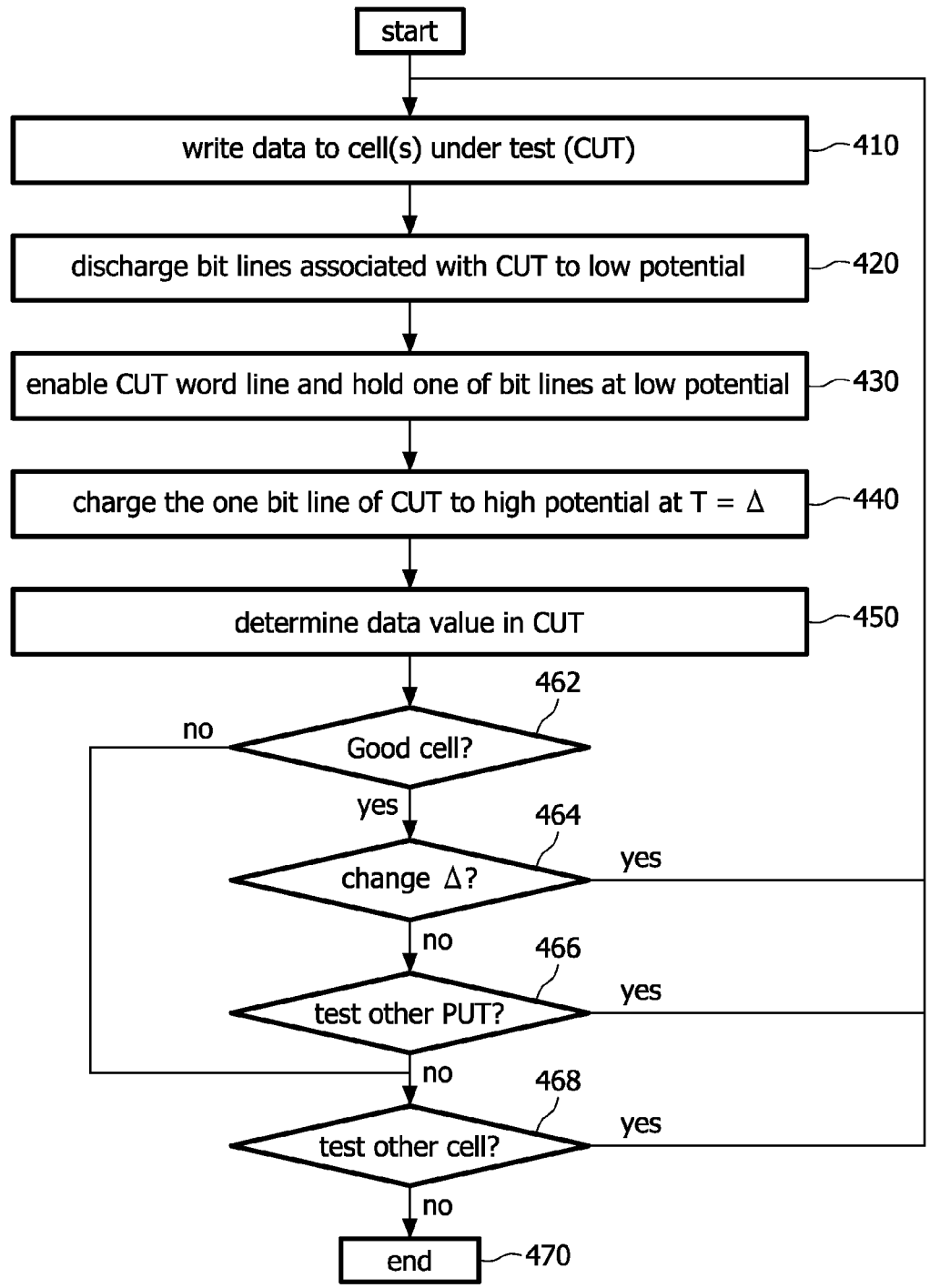
FIG. 4 shows a flowchart of the method of the present invention.

The testing method of the present invention, of which an embodiment is given in FIG. 4, will now be explained in more detail with the aid of FIGS. 1 and 5.

The principle of the present invention is based on the fact that the bit lines BL and BLB have a non-negligible capacitance. When conductively coupled to a high potential source via one of the PUTs of the cell under test (CUT), this capacitance needs to be charged for the bit line to reach this potential. A weak SRAM cell typically suffers from some structural defect, e.g. spot defects such as resistive open defects, a bridging defect, an excessive threshold shift and so on. Such defects significantly reduce the capability of the pull-up transistors, e.g. PUTs 102 and 202, to charge the capacitances of their associated bit lines. This characteristic is exploited in the following way.

The method starts in step 410 with writing background data to the CUT. The data is written to the CUT to bring the cell in a well-defined state. More than one cell may be simultaneously provided with data at the same time, e.g. all the cells that share a word line WL.

For instance, a logic '0' may be written to the CUT. This is typically achieved by charging the bit line BLB to a high voltage potential such as the supply voltage ($V_{dd}$) and grounding the bit line BL, after which the word line WL is enabled. This leads to the high potential being stored onto node 1, with the low potential being stored on node 2. Since node 1 is coupled to the control terminals of pull-up transistor (PUT) 202 and pull-down transistor (PDT) 204, the high potential on node 1 switches off PUT 202 and switches on PDT 204. Similarly, the low potential on node 2 switches on PUF 102 and switches off 104. This causes node 2 to be further pulled to ground and node 1 to be further pulled to $V_{dd}$. Hence, node 2, i.e. the 'true' bit, is set to a logic '0' and node 1, i.e. the 'false' bit, is set to a logic '1'.

However, the following steps of the method of the present invention are equally applicable for a logic '1' written to the CUT, as will be explained in more detail later.

After the write cycle of the CUT, its word line WL is disabled, and its bit lines BL and BLB are pulled down to the low potential, e.g. ground in step 420. Next, the word line WL is enabled again in step 430. This switches on the enabling transistors 106 and 108, thus conductively coupling the cross-coupled inverter of the CUT to the grounded bit lines BL and BLB, which causes the node of the CUT in FIG. 1 that carries a logic '1', i.e. which was pulled up to a high potential during the write action in step 410, to be pulled down towards the low potential.

During a first part Δ of the word line WL enable period, the bit line BLB is kept grounded, to ensure that node 1 is kept grounded, and that PUT 202 is kept switched on. In the meantime, bit line BL has been released to a floating state, which may have been done prior to or coinciding with the moment of enabling of the word line WL. Because the bit line BLB is kept grounded, the node 1 is kept at a low potential, which means that PUT 202, having its control terminal coupled to node 1, is kept switched on. Consequently, the PUT 202, if functioning correctly, will start to charge, i.e. pull up, the floating bit line BL during the period Δ.

After the period Δ but still during the word line enable period, the bit line BLB is pulled up to a high potential, e.g. $V_{dd}$ in step 440. At this point, the difference in behaviour of a good CUT and a weak CUT will become apparent. In the case of a good CUT, during the period Δ the potential on node 2 will have been pulled up by the PUT 202 to such an extent that the PDT 104 will have become enabled, while PUT 102 will have become disabled. Consequently, even though bit line BLB is pulled up, the node 1 of the CUT cannot be significantly pulled up because of its enabled PDT 104. Therefore, PDT 202 will remain enabled, and the node 2 will be further pulled up, ultimately leading to a logic '1' being stored in the CUT.

In contrast, for a weak CUT, e.g. a cell having a resistive open in the conductive path between PDT 202 and the high potential source, the forced activation of PDT 202 during the period Δ will not lead to a significant rise in the potential on node 2 because of the inability of the PUT 202 to charge the capacitance of the floating bit line BL. Consequently, when bit line BLB is pulled up, the node 1 will be pulled up as well, because the relatively low potential on node 2 switches on the PUT 102 rather than the PDT 104. Consequently, PUT 202 is switched off and PDT 204 is switched on, which causes a further drop in the potential on node 2, ultimately leading to a logic '0' being stored in the CUT.

Hence, by reading out the CUT in step 450, a good cell can immediately be distinguished from a weak or faulty cell by determining the bit value stored in the cell.

Figure 5:
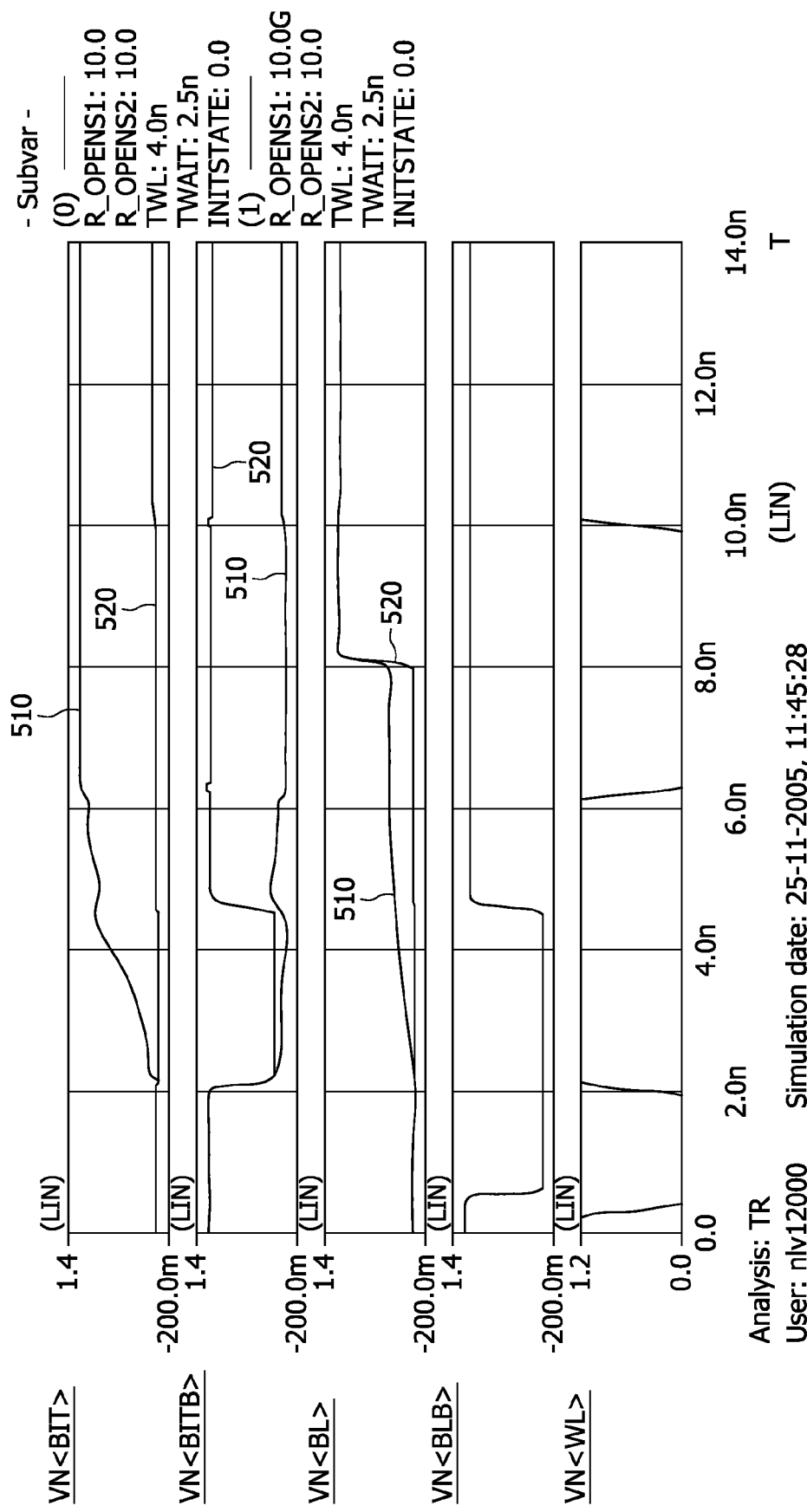
FIGS. 5-7 show the simulation results of the difference in behaviour between a good SRAM cell and SRAM cells having resistive open or bridging defects when subjected to the method of the present invention.

FIG. 5 depicts the simulation results of the test method of the present invention applied to a good CUT and a CUT having a resistive open of 10 GΩ. The simulated transients of the good CUT are labelled 510 and the simulated transients of the weak CUT are labelled 520. FIG. 5 depicts, from top to bottom, the voltage potential on node 2, the voltage potential on node 1, the voltage potential on the bit line BL, the voltage potential on the bit line BLB and the voltage potential on the word line WL.

The simulation starts on t=0.0 ns with both bit line BLB and word line WL carrying a high potential, after which the word line WL is discharged, i.e. disabled. This signals the end of the data write cycle (step 410), in which a logic '0' was written into the CUT, as can be seen from the high potential on node 1 and the low potential on node 2. Shortly thereafter (at t≈0.8 ns), the bit line BLB is discharged (step 420), after which the word line WL is enabled again at t=2.0 ns (step 430) to enable transistors 106 and 108. This rapidly discharges node 1, thus enabling the PUT 202 associated with node 2, as previously explained. This causes a distinctive increase in the potential on node 2 for the good CUT, with the floating bit line BL also being charged via PUT 202.

In contrast, the transients 520 of the weak CUT indicate that the resistive open in this CUT prevent a significant increase in the potential on node 1 and its associated bit line BL, as previously explained. Hence, at t≈4.5 ns, node 2 of the good CUT carries a significantly higher potential than node 1, whereas in the weak CUT, both node 1 and node 2 carry substantially similar and relatively low potentials, due to the inability of the active PUTs in this cell to pull up the associated bit lines. Hence, when the bit line BLB is pulled up to the high potential again at t=4.5 ns, node 1 of the weak cell is quickly pulled up, whereas for the good cell the increased potential on node 2 prevents a pull-up of node 1, as previously explained. The subsequent read out of the bit value of the CUT confirms whether the cell is fault-free.

At this point, it is emphasized that in step 420 the bit line coupled to the PUT under test may not be fully discharged, i.e. the bitline may be kept at a residual potential. This bias ensures that the PUT will switch on in the subsequent steps of the method.

The delay Δ between the activation of the word line WL in step 430 and the release of bit line BLB from ground, i.e. the charging of the bit line BLB to the high potential in step 440 is chosen such that a good cell has been given enough time to sufficiently pull up the potential on node 2 and its associated bit line BL such that PDT 104 of node 1 becomes enabled.

The memory under test may comprise reference or replica cells for dynamically determining the appropriate value of Δ. To this end, the method may apply the method steps applied to the CUT in parallel to the corresponding replica cell. The bit lines of the replica cell are monitored, and as soon as the potential on the bit line associated with the active PUT of the replica cell has reached a predefined threshold, step 440 may be executed on the CUT. This ensures that a value of Δ appropriate for the technology in which the memory is realized is used, e.g. whether the technology has relatively slow or fast conduction behaviour. The replica cell may comprise a number of memory cells coupled in parallel to amplify the potential swing on the monitored bit line to facilitate a more accurate determination of the appropriate value of Δ.

In step 450, the bit value stored in the CUT is determined. This can for instance be done by reading out the CUT. As is immediately apparent from the transients in FIG. 5, the good CUT carries a high potential on node 2 and a low potential on node 1 after the charging of the bit line BLB in step 440. In other words, the good CUT now holds a logic '1'. The weak CUT carries a low potential on node 2 and a high potential on node 1 after the charging of the bit line BLB in step 440. In other words, the weak CUT still holds a logic '0'. It will be apparent that application of the method of the present invention leads to the state of the bit in the good cell being flipped in contrast to a weak cell, which retains its original bit value in case of a logic '0' being written to the CUT in step 400.

However, it is emphasized that an initial logic '1' bit value in the CUT would have led to the same final state of the CUT. This can be understood by the fact that the combination of steps 420 and 430 results in the high potential node of the CUT being pulled down towards the low potential, regardless of which node stored the high potential. However, if the node that is coupled to the floating bitline during the execution of step 440 of the present invention initially carried a logic '1', i.e. was brought to the high potential during the data witing step 410, it is likely that in this situation, this node has not been fully discharged during the execution of step 430 of the present invention. This typically has an impact on the appropriate value of Δ, because this node now requires less time to reach a state in which the PDT it controls becomes enabled.

In step 462 the bit value retrieved from the CUT is evaluated. In case it is concluded that the tested SRAM cell is a weak or faulty cell, the test of that cell is concluded. If another cell is to be tested, as decided in step 468, the same test procedure will be applied to the other cell, otherwise the method is terminated in step 470.

To improve the fault coverage, the CUT may be applied to further tests. For instance, the delay Δ between charging the word line of the CUT in step 430 and the charging of the appropriate bit line of the CUT in step 440 may be altered in step 464. As has been explained with the aid of FIG. 5, the time required for a CUT to charge the capacitance of its associated bit line via one of its enabled PUTs is a function of the resistance over the conductive path between the bit line capacitance and the high potential source, e.g. $V_{dd}$. An increase in this resistance will increase the charge time of the capacitance, and will therefore increase the time required for successfully enabling the PDT controlled by the node coupled to the floating bit line. This time is also related to the SNM of the CUT; therefore, by varying Δ in respective test cycles, an indication of the SNM of the CUT can be determined.

In step 466, it may be decided to repeat the steps of the method for the CUT to test the other PUT of the CUT, in which case the role of the bit lines BL and BLB in the various steps of the test is interchanged. This way, the resistance of the conductive path between the high potential source and bit line BLB via PUT 102 and enable transistor 106 is also explicitly tested.

Typically, the steps of the method are repeated until all cells of the SRAM have been tested. This is checked in step 468, after which the method is completed in step 470.

It will be appreciated that the test method of the present invention can be applied to conventional SRAM devices, which may be stand-alone devices or embedded SRAMs, without the SRAM requiring dedicated test structures to facilitate the weak cell detection. The only requirement is that the bit lines and word lines have to be controllable to apply the appropriate waveforms to these lines, such as the waveforms shown in FIG. 5. Such controllability is usually available for conventional SRAMs.

Figure 6:
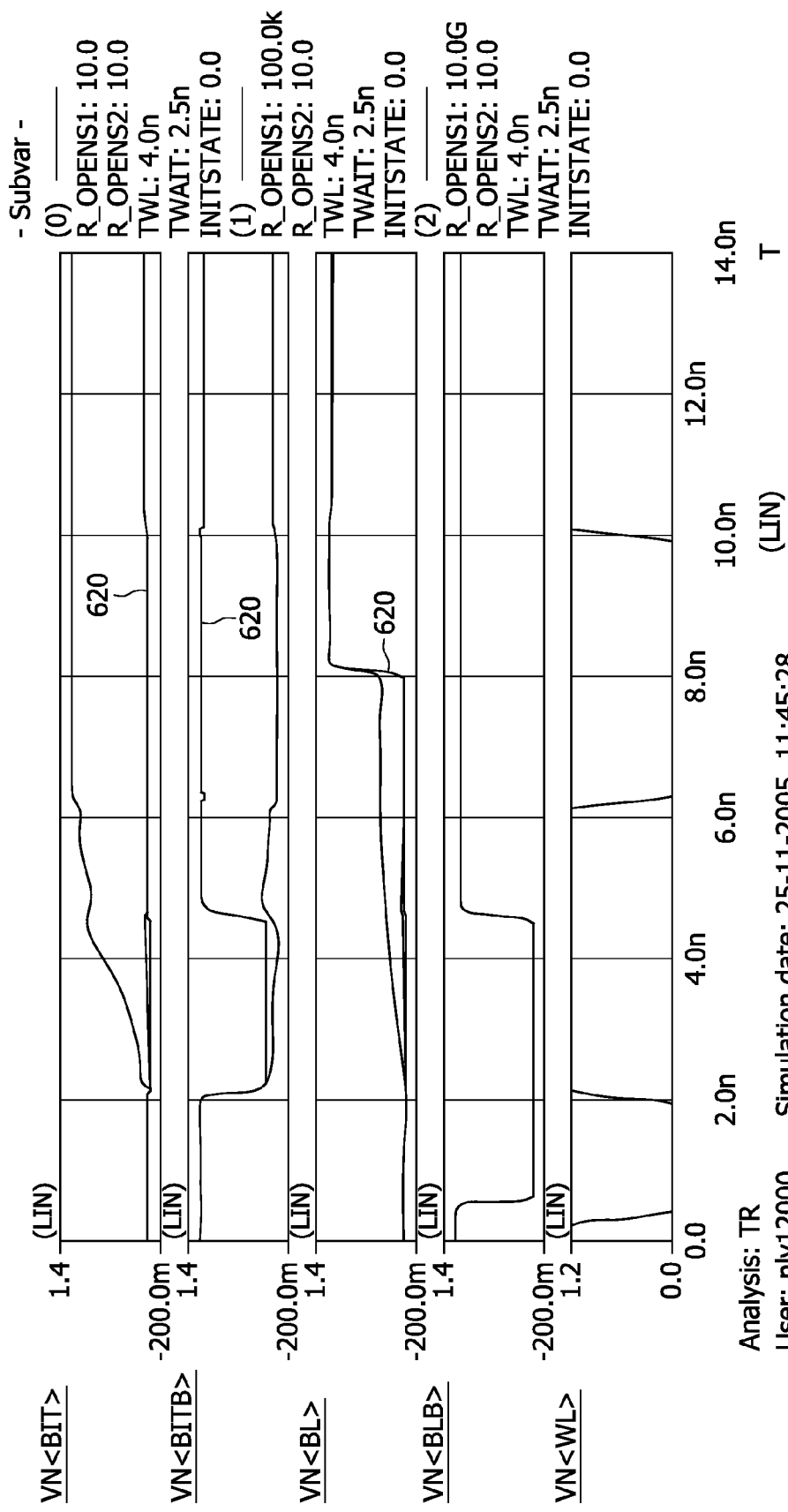

The method of the present invention is capable of detecting a wide range of faults that may not be detected with conventional memory tests such as march tests. In FIG. 5, it is demonstrated that a relatively strong resistive open of R=10 GΩ can be detected. However, much weaker resistive defects can also be uncovered; FIG. 6 shows the simulation results of a good cell compared with a cell carrying a resistive open of R=100 kΩ. The transients of the cell with the resistive open are labelled with reference numeral 620. It is immediately apparent that this cell also is incapable of effectively charging node 2 and its associated bit line BL after its associated word line WL has been enabled.

Figure 7:
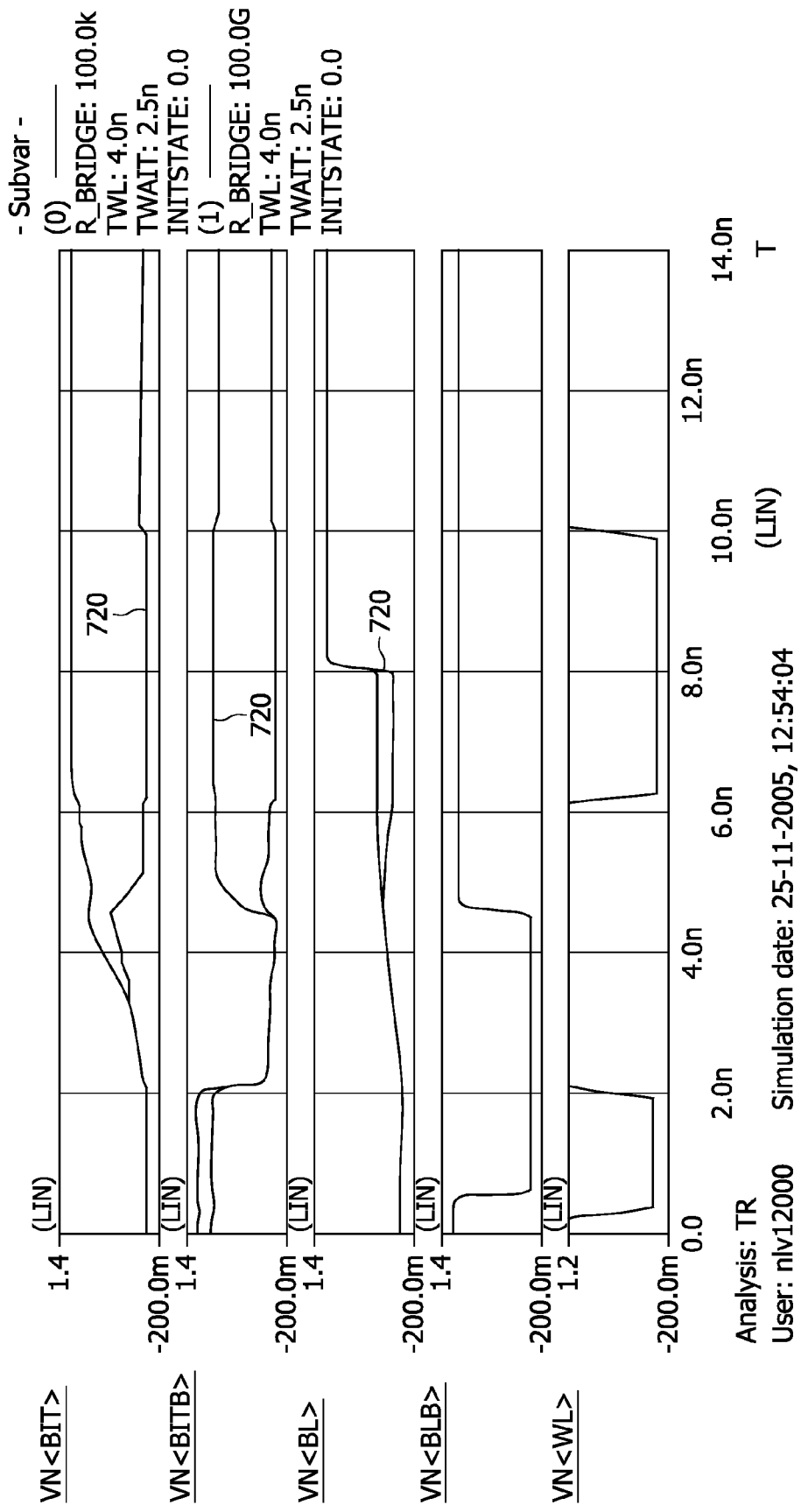

FIG. 7 shows the simulation results of the behaviour of the good cell compared with a cell having a bridging short between node 1 and node 2. In the good cell, the resistive path between these two nodes has a value of R=100 GΩ, whereas in the faulty cell, this path has a resistive value of R=100 kΩ. The transients of the faulty cell are labelled with reference numeral 720. It is immediately apparent that at t=Δ, i.e. the moment when bit line BLB is charged to Vdd during the word line being enabled (at t≈4.5 ns) the state of the CUT rapidly reverts back to its initial state, thus clearly demonstrating that cells having such bridging defects (shorts) can also be detected using the method of the present invention.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method for testing a static random access memory having a plurality of memory cells, each memory cell comprising a cross-coupled inverter pair coupled between a high potential source and a low potential source, the first inverter of the inverter pair having its control terminals coupled to a first bit line via a first enable transistor, and the second inverter of the inverter pair having its control terminals coupled to a second bit line via a second enable transistor, the first and second enable transistors having their respective control terminals coupled to a word line, the method comprising:
   (a) writing a first bit value into a first memory cell;
   (b) disabling the first and second enabling transistors of the first memory cell;
   (c) discharging the first bit line and the second bitline coupled to the first memory cell to a low potential;
   (d) activating the word line coupled to the memory cell for a predetermined period whilst keeping the first bit line coupled to the first memory cell at the low potential during a predetermined part (Δ) of said period;
   (e) bringing said first bit line to a high potential upon completion of the predetermined part (Δ); and
   (f) determining the bit value of the cell under test after the predetermined period.

2. A method as claimed in claim 1, wherein steps (a)-(f) are repeated for a different predetermined part.

3. A method as claimed in claim 1, further comprising:
   (g) writing a second bit value into the memory cell;
   (h) disabling the first and second enabling transistors;
   (i) discharging the second bit line and the first bit line to the low potential;
   (j) activating the word line coupled to the memory cell for a further predetermined period whilst keeping the second bit line at the low potential during a further predetermined part (Δ) of said further period;
   (k) bringing the associated second bit line to the high potential upon completion of the further predetermined part (Δ);
   (l) determining the further bit value of the cell under test after the predetermined period.

4. A method as claimed in claim 3, wherein the steps (g)-(l) are repeated for a different predetermined delay (Δ).

5. A method as claimed in claim 1, wherein the steps (a)-(f) are repeated for each memory cell of the static random access memory.

6. A method as claimed in claim 3, wherein the steps (g)-(l) are repeated for each memory cell of the static random access memory.

* * * * *